United States Patent
Cideciyan et al.

(10) Patent No.: US 9,170,933 B2
(45) Date of Patent: Oct. 27, 2015

(54) WEAR-LEVEL OF CELLS/PAGES/SUB-PAGES/BLOCKS OF A MEMORY

(75) Inventors: Roy D. Cideciyan, Rueschlikon (CH); Evangelos S. Eleftheriou, Rueschlikon (CH); Robert Haas, Rueschlikon (CH); Xiao-Yu Hu, Rueschlikon (CH); Ilias Iliadis, Rueschlikon (CH); Roman Pletka, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 13/700,545

(22) PCT Filed: Jun. 6, 2011

(86) PCT No.: PCT/IB2011/052492
§ 371 (c)(1),
(2), (4) Date: Mar. 4, 2013

(87) PCT Pub. No.: WO2012/001556
PCT Pub. Date: Jan. 5, 2012

(65) Prior Publication Data
US 2013/0166827 A1    Jun. 27, 2013

(30) Foreign Application Priority Data
Jun. 28, 2010  (EP) .................................. 10167547

(51) Int. Cl.
G06F 9/312     (2006.01)
G06F 12/02     (2006.01)
G11C 16/34     (2006.01)

(52) U.S. Cl.
CPC ........ G06F 12/0246 (2013.01); G11C 16/3495 (2013.01); G06F 2212/7211 (2013.01)

(58) Field of Classification Search
CPC ................... G06F 12/0246; G06F 2212/7211; G06F 12/0253; G06F 2212/2022; G06F 12/00; G06F 12/0802
See application file for complete search history.

(56) References Cited

U.S. PATENT DOCUMENTS 6,292,868 B1 *  9/2001  Norman ........................ 711/103
6,721,194 B2    4/2004  Sekiguchi et al.
(Continued)

FOREIGN PATENT DOCUMENTS

CN    1701390      11/2005
CN    101083138    12/2007
(Continued)

OTHER PUBLICATIONS

International Search Report dated Sep. 6, 2011 for PCT/IB2011/052492.

*Primary Examiner* — Cheng-Yuan Tseng
*Assistant Examiner* — Candice Rankin
(74) *Attorney, Agent, or Firm* — Fleit Gibbons Gutman Bongini & Bianco PL; Jon A. Gibbons

(57) ABSTRACT

A method for wear-leveling cells, pages, sub-pages or blocks of a memory such as a flash memory includes receiving (S10) a chunk of data to be written on the cell, page, sub-page or block of the memory; counting (S40), in the received chunk of data, a number of times a given type of binary data '0' or '1' is to be written; and distributing (S50) the writing of the received chunk of data among cells, pages, sub-pages or blocks of the memory such as to wear-level the memory with respect to the number of the given type of binary data '0' or '1' counted in the chunk of data to be written.

18 Claims, 2 Drawing Sheets

(56) References Cited

U.S. PATENT DOCUMENTS

| | | |
|---|---|---|
| 7,237,074 B2 | 6/2007 | Guterman et al. |
| 7,242,615 B2 | 7/2007 | Nagashima |
| 7,366,017 B2 | 4/2008 | Abraham |
| 2007/0118688 A1* | 5/2007 | Lee et al. .................. 711/113 |
| 2008/0094914 A1 | 4/2008 | Park et al. |
| 2008/0215800 A1 | 9/2008 | Lee et al. |
| 2009/0080249 A1 | 3/2009 | Sprouse et al. |
| 2009/0122610 A1 | 5/2009 | Danon et al. |
| 2009/0207666 A1 | 8/2009 | Park et al. |
| 2010/0011260 A1 | 1/2010 | Nagadomi et al. |
| 2010/0174845 A1* | 7/2010 | Gorobets et al. ............. 711/103 |
| 2010/0177564 A1* | 7/2010 | Feeley et al. ............. 365/185.09 |

FOREIGN PATENT DOCUMENTS

| | | |
|---|---|---|
| CN | 101221813 | 7/2008 |
| CN | 101535967 | 9/2009 |
| JP | 2001-056785 | 2/2001 |
| JP | 2008-217857 | 9/2008 |
| WO | 2008005735 | 1/2008 |
| WO | 2008145070 | 12/2008 |
| WO | WO2009084797 | 7/2009 |

* cited by examiner

WEAR-LEVEL OF CELLS/PAGES/SUB-PAGES/BLOCKS OF A MEMORY

CROSS-REFERENCE TO RELATED APPLICATIONS

This application is based upon and claims priority from prior Patent Cooperation Treacty Application No. PCT/IB2011/052492 filed on June 8, which is based on and claims priority fom European Patent Application No. 10167547.8, filed on Jun. 28, 2010, and, the entire disclosure of each are hereby incorporated by reference herein.

FIELD OF THE INVENTION

The invention relates to the field of management of memory, and specifically to wear-leveling techniques used in memory such as a flash memory.

BACKGROUND

Solid state memories or devices (also known as SSDs) store data, for example into a NAND-based flash memory. Operations performed on a SSD such as read and write operations are controlled by a solid-state memory controller or flash memory controller. Before writing new data on a segment of a SSD, data already written on the segment must be erased before new data can be overwritten. These memories can only sustain a limited number of erase-write cycles, usually between 10,000 and 1,000,000, which is commonly known as the endurance of these devices. Endurance is a critical design criterion for measuring the reliability of SSDs.

Flash memories are organized into a number of erase blocks or sectors and each must be erased prior to writing data. A typical erase block is 256 KB in size, however may range from 128 KB to 2,048 KB or even more. Any given address within an erase block cannot be rewritten without an intervening erase. Erase cycles are cumulative and affect only those erase blocks being cycled. In other words, an error in any erase block is constrained to the data of that block. Erase cycles range from 10,000 to 1,000,000, depending on vendor's manufacturing process.

Wear-leveling is a common technique used to prolong the lifetime of SSDs. This function is normally implemented in the solid-state memory controller or flash memory controller. Wear-leveling allows data writes to be evenly distributed over the entire storage media. More precisely, wear-leveling is an algorithm by which the controller in the storage device evens out the overall wear among all Flash blocks, e.g. by re-maping logical block addresses to different physical block addresses in the SSD.

There are a lot of existing wear-leveling algorithms in the prior art. They focus on utilizing every flash block evenly. These algorithms differs from each other mainly in terms of the frequency of block re-mapping, the algorithm to find the "least worn" blocks to which to write and variations of data block swapping capabilities. Depending on whether static data blocks are moved around or not, these algorithms can be classified into two categories: dynamic wear-leveling and static wear-leveling. A wear-leveling algorithm is called dynamic if it does not move around static data blocks, otherwise it is called static.

All the existing wear-leveling algorithms, either dynamic or static, operate at the block level, namely they aim to balance erase/write operations on all flash blocks available in the SSD. However, the actual wear caused to any specific cell is proportional to the number of 0s ever being written to it. For example, if flash cells have an endurance specification of 10,000 erase/write cycles, each cell can therefore be erased and written 10,000 times with 0s. Therefore, since chunks of data that are written to flash blocks can be seen as being random, hence not necessarily having the same number of 0s, flash blocks may likely experience significantly different levels of wear due to the varying number of 0s being written onto them, thereby leading to portion of blocks being worn out much earlier than others.

Hence, the drawback of block-level wear-leveling arises mainly due to the fact that different data blocks may impose different wear on flash blocks, and thus the actual wear on any two blocks can be significantly different even though both have exactly the same number of erase-write operations.

Since a flash cell is the minimum memory unit which can potentially lead to a failure of the whole block, a cell-based wear-leveling algorithm that tracks and controls the wear of individual memory cells is desirable.

BRIEF SUMMARY OF THE INVENTION

According to a first aspect, the invention is embodied as a method for wear-leveling cells or pages or sub-pages or blocks of a memory such as a flash memory. The method comprises:

receiving a chunk of data to be written on a cell or page or sub-page or block of the memory;

counting in the received chunk of data the number of times a given type of binary data '0' or '1' is to be written; and distributing the writing of the received chunk of data amongst cells or pages or sub-pages or blocks of the memory such as to wear-level the memory with respect to the number of the given type of binary data '0' or '1' counted in the chunk of data to be written.

In embodiments, the method may comprise one or more of the following features:

distributing the writing of the received chunk of data is further carried out with respect to wear-leveling information associated with each one of the cells or pages or sub-pages or blocks of the memory;

the wear-leveling information are the number of '0s' already written on a cell or page or sub-page or block of the memory;

maintaining a pool of received chunks of data;

the chunk of data having the largest number of '0s' among the received chunks of data of the pool is written on the cell or page or sub-page or block of the memory having the wear-leveling information representative of the least worn-out cell or page or sub-page or block of the memory;

the chunk of data having the smallest number of '0s' among the received chunks of data of the pool is written on the cell or page or sub-page or block of the memory having the wear-leveling information representative of the most worn-out cell or page or sub-page or block of the memory the least worn-out cell or page or sub-page or block of the memory is associated with the wear-leveling information having the smallest number of '0s'; and the most worn-out cell or page or sub-page or block of the memory is associated with the wear-leveling information having the largest number of '0s';

each one of the cells or pages or sub-pages or blocks of the memory are recorded in a counter with their respective wear-leveling information;

the cells or pages or sub-pages or blocks recorded in the counter are sorted;

the wear-leveling information are updated after each distribution of the writing of each received chunk of data;

distributing the writing of the received chunk of data is restricted on a set of cells or pages or sub-pages or blocks of the memory, the set of cells or pages or sub-pages or blocks of the memory comprising cells or pages or sub-pages or blocks of the memory having different wear-leveling information.

According to another aspect, the invention is embodied as a system for wear-leveling cells or pages or sub-pages or blocks of a memory such as a flash memory comprising:

means for receiving a chunk of data to be written on a cell or page or sub-page or block of the memory; and a memory controller;

wherein the memory controller counts in the received chunk of data a number of times a given type of binary data '0' or '1' is to be written; and distributes the writing of the received chunk of data amongst cells or pages or sub-pages or blocks of the memory such as to wear-level the memory with respect to the number of the given type of binary data '0' or '1' counted in the chunk of data to be written.

In embodiments, the system may comprise one or more of the following features:

the memory controller records the wear-leveling information for each cell or page or sub-page or block of the memory in a counter, and updates the wear-leveling information after each distribution of the writing of each received chunk of data;

the memory controller further comprises a write allocator maintaining a set of cells or pages or sub-pages or blocks of the memory, the set of cells or pages or sub-pages or blocks of the memory comprising cells or pages or sub-pages or blocks of the memory having different wear-leveling information;

According to another aspect, the invention is embodied as a computer program, stored on a computer readable medium, for wear-leveling cells or pages or sub-pages or blocks of a memory such as a flash memory, comprising code means for causing a computer to take the steps of the method according to the invention.

BRIEF DESCRIPTION OF THE DRAWINGS

A system and a process embodying the invention will now be described, by way of non-limiting example, and in reference to the accompanying drawings, where.

DETAILED DESCRIPTION OF THE EMBODIMENTS

The invention is directed to a method for wear-leveling cells or pages or sub-pages or blocks (cells/pages/sub-pages/blocks) a memory such as a flash memory. Wear-leveling cells/pages/sub-pages/blocks means evening out the wear of cells/pages/sub-pages/blocks of the memory. To this aim, a chunk of data to be written on a cell/page/sub-page/block of the memory is received. Then, the number of times a given type of binary data '0' or '1' to be written is counted in the received chunk of data. Next, the writing of the received chunk of data amongst cells/pages/sub-pages/blocks of the memory is distributed such as to wear-level the memory with respect to the number of the given type of binary data '0' or '1' counted in the chunk of data to be written.

In a memory such as a flash memory, the chunk of data stored thereon is represented with a binary system, also called base-2 number system. This means that the chunk of data is composed of binary data which are represented by numeric values using two symbols: '0' and '1'. This amounts to saying that binary data are represented by '0s' and/or '1s'. Consequently, when the number of a given type of binary data within a data chunk is counted (for example the '0s'), the number of the other given type of binary data within the data chunk is also implicitly counted (for example the '1s'). In other words, counting the '0s' amounts to counting the '1s', and conversely.

Hence, the present invention proposes a new solution for wear-leveling memory, e.g., memory of a solid-state device such as flash memory. The present invention relies on statistical cell-based wear-leveling. The statistical cell-based wear-leveling aims to maintain even wear over all cells of the memory, instead of a rough even wear over blocks as known in the art. The present invention works on the principle that only writing '0' to a cell causes wear to it and thus keeping the total number of '0'-written statistically uniformly for all cells achieves even wear on the cell level. An embodiment of the invention keeps track of the number of '0'-written at cell/page/sub-page/block level, computes the number of 0s of incoming data chunks to be written on the memory, and writes chunks of data with less 0s to the cell/block/page/sub-page with high '0'-writing history and conversely.

Figure 1:
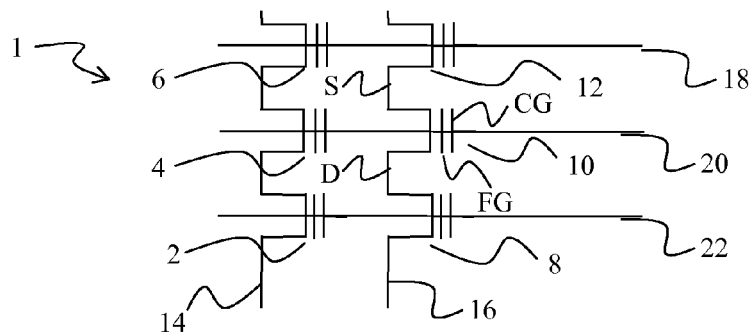
FIG. 1 is a schematic view of a flash memory.

Referring now to FIG. 1, a schematic view of a flash memory 1 such as a NAND memory is depicted. The flash memory 1 stores information in an array of cells made from floating-gate transistors 2, 4, 6, 8, 10, 12. A floating-gate transistor is a field effect transistor similar to a conventional MOSFET which comprises a drain (D), a source (S) and a gate, but a floating-gate transistor further comprises an electrically isolated floating gate (FG) wherein electrons may be trapped. On FIG. 1, the cell 10 comprises a drain (D), a source (S), a control gate (CG), and a floating gate (FG).

The floating-gate transistors 2, 4, 6 of the flash memory 1 are connected in series and thus form a first bit line 14. The floating-gate transistors 8, 10, 12 are connected in series and form a second bit line 16. For instance, the drain (D) of the cell 10 is connected in series with the source of the cell 8, and the source (S) of the cell 10 is connected in series with the drain of the cell 12. Moreover, the cells made of floating-gate transistors (2, 8), respectively (4, 10) and (6, 12), are connected via their respective control gate (CG) to a word line 22, respectively the word lines 20 and 18. It will be understood that FIG. 1 shows only a small portion of the array of cells forming the flash memory 1.

Each individual cell 2, 4, 6, 8, 10, 12 can be programmed by applying a voltage to the control gate (CG) and the drain (D), and grounding the source (S). Electrons are injected into the floating gate and are trapped in the floating gate which is therefore charged. As a result, the cell is set to a binary data '0'.

Each individual cell 2, 4, 6, 8, 10, 12 can be erased in several way. An approach can be to ground the control gate (GC) and apply a voltage to the source (S) so that the trapped electrons go from the floating gate (FG) to the source (S). Consequently, the floating gate is discharged and the cell is set to a binary data '1'.

In a single-level cell (SLC) memory, a cell stores only one bit (a binary data '0' or '1'). In a multi-level cell (MLC) device, a cell can store more than one bit (e.g. two binary data).

Therefore, an electrical charge trapped on the floating gate of the cell determines the logic level read from the cell of the memory. In slightly simplified terms, the memory works as follows: programming a binary data '0' (commonly called writing a '0') on the flash memory is equivalent to charging the floating gate, bringing the logic value to zero. Moreover, it is only possible to program (that is, charging the floating gate) a cell that has been erased. In addition, when erasing a cell, a binary data '1' is programmed on the floating gate of the flash memory, and it is equivalent to discharge the cell which is read as logic '1'.

A memory such as a flash memory is arranged in pages, sub pages, and blocks. Each block consists of a number of pages which are typically 512 or 2,048 or 4,096 bytes in size. Each page is associated with a few bytes for storing of an error correcting code (ECC) checksum. Typically, a page comprises a plurality of cells and a block comprises a plurality of pages. In addition, a page may be divided into sub pages; for instance a page of 4,096 bytes in size may be divided into 8 sub pages of 512 bytes each. The cell of a memory is the smallest unit for storing a binary data.

Figure 2:
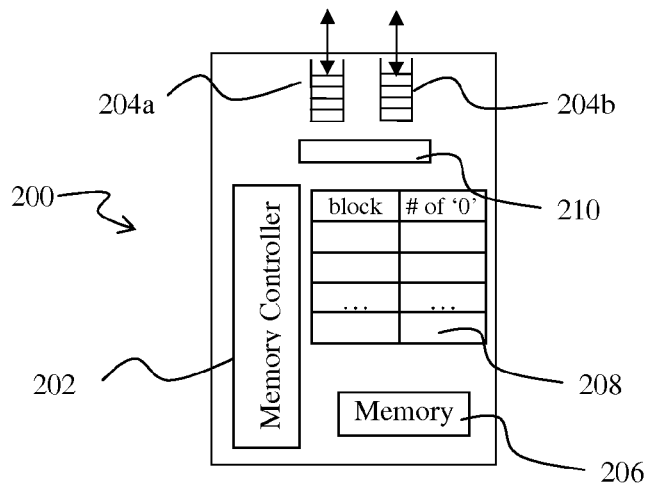
FIG. 2 is schematic view of a solid state device.

Referring now to FIG. 2, a schematic view of a solid state device (or solid state memory) is depicted. The solid state device 200 comprises a main memory 206; for example a flash memory such as a NAND memory as depicted in FIG. 1. Incidentally, the main memory may comprise one or more chips. A chip is an integrated circuit comprising a plurality of cells. The solid state device 200 may comprise a memory controller 202 which implements functions for performing operations performed on the SSD 200 such as read, write, and erase operations. The memory controller may implement other functions for the management of the SSD 200. In addition, the SSD 200 comprises input/output (I/0) interfaces 204a and 204b for exchanging data with a device (e.g. a computer). The I/0 interfaces allow the receiving of chunks of data to be written on the main memory 206 and the sending of chunks of data already stored on the main memory 206. The I/0 interfaces may be connected with a secondary memory 210 on which the received chunks of data can be temporarily stored. This secondary memory 210 aims at providing a pool of received chunks of data intended to be written on the main memory 206. The secondary memory 210 behaves as a data buffer and may be DRAM, flash, or another memory technology. Hence, the received chunks of data are stored on the secondary memory 210 in a first step, and they are moved to the main memory 206 in a second step. The operations performed on the pool of received chunks of data are managed by the memory controller 202. The SSD 200 may also comprise a counter 208 on which wear-leveling information associated with each one of the cells/pages/sub-pages/blocks of the main memory 206 are recorded thereon. The wear-leveling information of a cell/page/sub-page/block represent the remaining service life of the main memory 206, e.g., a flash memory. In other words, the wear- leveling information characterize how many supplementary erase/write cycles can be performed on a cell/page/sub-page/block of the main memory 206. In practice, the counter 208 is a memory which may be DRAM, flash, or another memory technology, and operations performed on the counter 208 are controlled by the memory controller 202.

It will be understood that the main memory 206 is commonly called memory; for the sake of clarity and for distinguishing different memories of the solid state device 200, the terms main memory 206, secondary memory 210 and counter 208 have been introduced.

Figure 3:
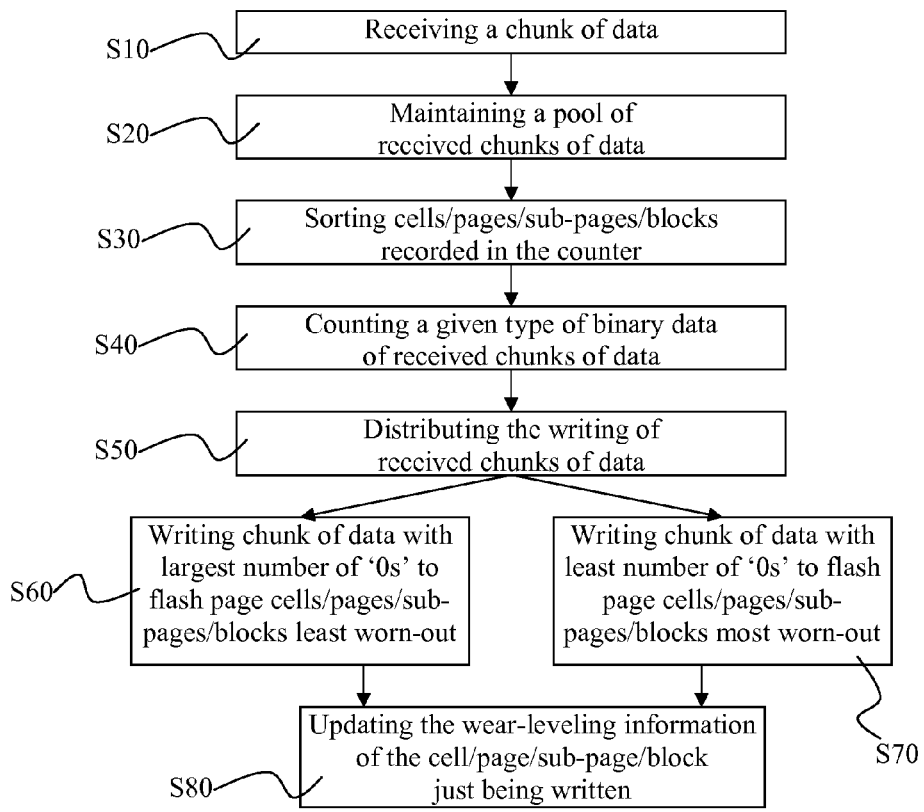
FIG. 3 is a flowchart of an embodiment of a process according to the invention.

Referring now to FIG. 3, a flowchart of an embodiment of method for wear-leveling cells/pages/sub-pages/blocks of a memory such as a flash memory is depicted, for example in view of an embodiment of the solid state device 200.

At step S10, a chunk of data is received. As discussed in reference to FIG. 2, the solid state device 200 can receive the chunk of data through input/output (I/O) interfaces 204a and 204b.

Next, at step S20, the received chunk of data is stored with other chunks of data previously received so that a pool of received chunks of data is maintained. The pool of received chunks of data may be stored on the secondary memory 210 of the SSD 20. Thus, the pool comprises the next chunk of data to be written on a cell/page/sub-page/block of the memory.

Then, at step S30, the cells/pages/sub-pages/blocks recorded in a counter are sorted (S30). The sorting is carried out according to the respective wear-leveling information associated with each one of the cells/pages/sub-pages/blocks.

The wear-leveling information of a cell/page/sub-page/block of the memory may be the number of '0s' already written on the cell/page/sub-page/block of the memory. Indeed, it is only possible to program a cell that has been erased, that is, a binary data '1' is programmed on the floating gate of the flash memory; this involves that the actual wear caused to any specific cell is proportional to the number of 0s ever being written to it. Therefore, one understands that the least worn-out cell/page/sub-page/block of the memory is associated with the wear-leveling information having the smallest number of '0s'. On the contrary, the most worn-out cell/page/sub-page/block of the memory is associated with the wear-leveling information having the largest number of '0s'. The sorting of the wear-leveling information allows to easily identify the most and the least worn-out cell/page/sub-page/block of the memory.

In practice, the counter (e.g. a memory) permanently counts the number of '0s' written on each cell/page/sub-page/block of the memory, so that a table which associates a number of '0s' written on each cell/page/sub-page/block is maintained by the counter. The cells/pages/sub-pages/blocks recorded on the table can be easily sorted according to their respective number of '0s'.

Whether wear-leveling information are recorded for each cell or page or sub-page or block represents a trade-off between the implementation complexity/cost and the wear-leveling effectiveness. Maintaining a per-(sub-)page wear-leveling information has the highest wear-leveling effectiveness at the expense of the highest implementation complexity and cost, while per-block counters require the least implementation effort but come with the least wear-leveling effectiveness.

Next, at step S40, a number of times a given type of binary data '0' or '1' is to be written on a cell/page/sub-page/block of the memory is counted for each chunk of data received. In practice, the number of '0s' or '1s' counted in the chunk of data is stored in a memory, e.g. the secondary memory 210.

Then, at step S50, the writing of a received chunk of data is distributed amongst cells/pages/sub-pages/blocks of the memory such as to wear-level the memory with respect to the number of the given type of binary data '0' or '1' counted in the chunk of data to be written. Thus, a cell-level wear-leveling may be carried out in a statistical sense, namely on the average and in the long run each cell will most likely experience similar wear in terms of the number of 0s being written on it since the distribution of the chunks of data is performed based on the number of '0s' in the chunk of data to be written. It is to be understood that the distribution of the chunks of data may be performed based on the number of '1s' in the chunk of data to be written as counting the number of '1s' in the chunk of data to be written implicitly amounts to count the number of '0s' in the chunk of data.

In addition, the writing of a received chunk of data may be distributed with respect to wear-leveling information associated with each one of the cells/pages/sub-pages/blocks of the memory. Advantageously, the wear-leveling is improved as it takes into account the wear-leveling of a particular cell.

Alternatively, the writing of a received chunk of data is restricted to a set of cells/pages/sub-pages/blocks of the memory wherein the cells/pages/sub-pages/blocks have different wear level information. This allows to write immediately a received chunk of data, thus significantly improving the consistency of the wear-leveling and the speed of processing of chunks of data.

In practice, the set of cells/pages/sub-pages/blocks of the memory is maintained by a write allocator managed by the main memory 202 of the solid state device 20.

Two modes of distribution (S60, S70) may be carried out. The steps S60 and S70 may be carried out concomitantly, successively, or alternatively.

At step 60, the distribution is performed such that the chunk of data having the largest number of '0s' among the received chunks of data of the pool is written on the cell/page/sub-page/block of the memory having the wear-leveling information representative of the least worn-out cell/page/sub-page/block of the memory. As seen above, the least worn-out cell/page/sub-page/block has the wear-leveling information having the smallest number of '0s' among the cells/pages/sub-pages/blocks of the memory.

Alternatively, the distribution may be performed such that the chunk of data having the smallest number of '1s' among the received chunks of data of the pool is written on the cell/page/sub-page/block of the memory having the wear-leveling information representative of the least worn-out cell/page/sub-page/block of the memory.

At step S70, the distribution is performed such that the chunk of data having the smallest number of '0s' among the received chunks of data of the pool is written on the cell/page/sub-page/block of the memory having the wear-leveling information representative of the most worn-out cell/page/sub-page/block of the memory; the most worn-out cell/page/sub-page/block having the wear-leveling information having the largest number of '0s' among the cells/pages/sub-pages/blocks of the memory.

Alternatively, the distribution may be performed such that the chunk of data having the largest number of '1s' among the received chunks of data of the pool is written on the cell/page/sub-page/block of the memory having the wear-leveling information representative of the most worn-out cell/page/sub-page/block of the memory.

Once the writing of a chunk has been performed, the wear-leveling information of the cell/page/sub-page/block just being written is updated (step S80). Typically, the update may be performed by transmitting to the counter 208 the number of times a given type of binary data '0' or '1' counted for the written chunk of data at step S40. This operation may be performed by the memory controller 202.

It is to be understood that the method of the invention can also be applied to the chips forming the main memory in a similar fashion. In this case, wear-leveling information are associated to each chip of the main memory.

The embodiment described in FIG. 3 has been described in view of a single-level cell (SLC) memory which can store only one bit.

In another embodiment, the method of the invention is applied to multi-level cell (MLC) memory in a similar fashion. Each cell in MLC comprises multiple bits, say 2 bits for instance. After erase, a cell is reset with a data pattern of 11 which means that the cell is discharged. Thus, if and only if other data patterns such as 01, 10, and 00 are written onto the cell, wear then takes place. Therefore, the invention can be naturally embodied on MLC memory by taking care of all these 01, 10, and 00 patterns.

More specifically, wear-leveling information is kept for each cell, page, sub-page, block for the number of the occurrences of any patterns of 01, 10, and 00 or groups of patterns that have been written on it. A pool of chunks of data to be written is maintained wherein the number of 01, 10 and 00 patterns is counted for each received chunk of data. Then the distributing of the writing of a chunk of data is carried.

As will be appreciated by one skilled in the art, aspects of the present invention may be embodied as a method, system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 4:
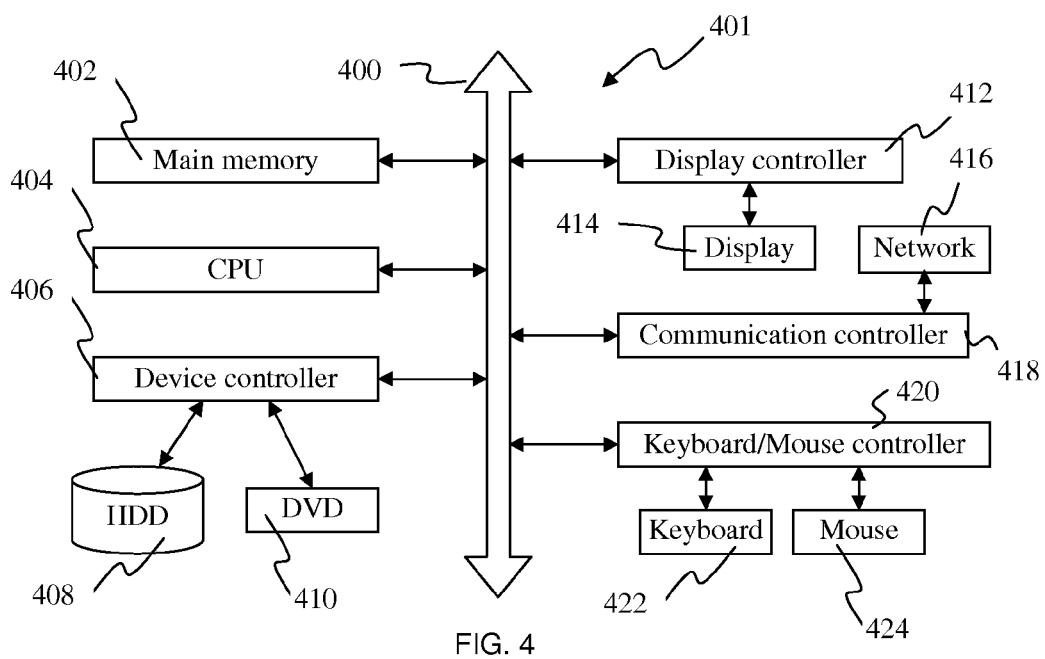
FIG. 4 is a block diagram of computer hardware according to an embodiment of the present invention.

FIG. 4 is a block diagram of computer hardware according to an embodiment of the invention. A computer system 401 according to an embodiment of the invention includes a CPU 404 and a main memory 402, which are connected to a bus 400. The bus 400 is connected to a display controller 412 which is connected to a display 414 such as an LCD monitor. The display 414 is used to display information about the computer system 401. The bus 400 is also connected to a storage device such hard disk 408 or DVD 410 through a device controller 406 such as an IDE or SATA controller. The bus 400 is further connected to a keyboard 422 and a mouse 424 through a keyboard/mouse controller 420 or a USB controller (not shown). The bus 400 is also connected to a communication controller 418 which conforms to, for example, an Ethernet protocol. The communication controller 418 is used to physically connect the computer system 401 with a network 416.

The invention claimed is:

1. A method for wear-leveling a memory, comprising:
receiving at least one chunk of data to be written on a cell/page/sub-page/block portion of the memory;
counting, in a received chunk of data, a number of times a given type of binary data '0' or '1' is to be written;
distributing writing of the received chunk of data among one of cells, pages, sub-pages and blocks of the memory to wear-level the memory with respect to a number of a given type of binary data '0' or '1' counted in the chunk of data to be written, and with respect to a number of '0s' already written on each one of the cells or pages or sub-pages or blocks of the memory; and
maintaining a pool of received chunks of data,
wherein a chunk of data having a largest number of '0s' among the received chunks of data of the pool is written on the cell or page or sub-page or block of the memory on which a smallest number of '0s' are already written.

2. The method of claim 1, wherein the cell/page/sub-page/block portion of the memory includes at least one of: a cell, a sub-page, a page and a block of the memory.

3. The method of claim 1, wherein the memory is a flash memory.

4. The method of claim 1, wherein a chunk of data having a smallest number of '0s' among the received chunks of data of the pool is written on the cell or page or sub-page or block of the memory on which a largest number of '0s' are already written.

5. The method of claim 4, wherein:
the least worn-out cell or page or sub-page or block of the memory is associated with wear-leveling information having a smallest number of '0s'; and
the most worn-out cell or page or sub-page or block of the memory is associated with wear-leveling information having the largest number of '0s'.

6. The method of claim 5, wherein each one of the cells or pages or sub-pages or blocks of the memory are recorded in a counter with their respective wear-leveling information.

7. The method of claim 6, wherein the cells or pages or sub-pages or blocks recorded in the counter are sorted.

8. The method of claim 5, wherein the wear-leveling information is updated after each distribution of the writing of each received chunk of data.

9. The method of claim 5, wherein distributing the writing of the received chunk of data is restricted to a set of cells or pages or sub-pages or blocks of the memory comprising cells or pages or sub-pages or blocks of the memory having different wear-leveling information.

10. The method of claim 1, wherein the pool includes a next chunk of data to be written on a cell/page/sub-page/block of the memory.

11. A system for wear-leveling a memory, comprising:
   means for receiving at least one chunk of data to be written on a cell or page or sub-page or block of the memory;
   a secondary memory for storing a pool of received chunks of data; and
   a memory controller, wherein the memory controller
      counts, in a received chunk of data, a number of times a given type of binary data '0' or '1' is to be written, and
      distributes writing of the received chunk of data among cells or pages or sub-pages or blocks of the memory such as to wear-level the memory with respect to a number of the given type of binary data '0' or '1' counted in the chunk of data to be written, and with respect to a number of '0s' already written on each one of the cells or pages or sub-pages or blocks of the memory,
   wherein a chunk of data having a largest number of '0s' among the chunks of data of the pool is written on the cell or page or sub-page or block of the memory on which a smallest number of '0s' are already written.

12. The system of claim 11, wherein the memory is a flash memory.

13. The system of claim 11, wherein the memory controller:
   records wear-leveling information for each cell or page or sub-page or block of the memory in a counter; and
   updates the wear-leveling information after each distribution of the writing of each received chunk of data.

14. The system of claim 13, wherein the memory controller comprises a write allocator for maintaining a set of cells or pages or sub-pages or blocks of the memory, and wherein the set of cells or pages or sub-pages or blocks of the memory includes cells or pages or sub-pages or blocks of the memory having different wear-leveling information.

15. The system of claim 11, wherein the pool includes a next chunk of data to be written on a cell/page/sub-page/block of the memory.

16. A computer program product for wear-leveling a portion of a memory, the computer program product comprising:
   a non-transitory computer readable medium; and
   computer program instructions for
      receiving at least one chunk of data to be written on a cell/page/sub-page/block portion of the memory,
      maintaining a pool of received chunks of data,
      counting, in the received chunk of data, a number of times a given type of binary data '0' or '1' is to be written,
      distributing writing of the received chunk of data among one of the cells, pages, sub-pages or blocks of the memory to wear-level the memory with respect to a number of a given type of binary data '0' or '1' counted in the chunk of data to be written, and with respect to a number of '0s' already written on each one of the cells or pages or sub-pages or blocks of the memory, and
      writing a chunk of data having a largest number of '0s' among the received chunks of data of the pool on the cell or page or sub-page or block of the memory on which a smallest number of '0s' are already written,
   wherein the portion of the memory includes at least one of: a cell, a sub-page, a page or a block of the memory.

17. The computer program product of claim 16, wherein the memory is a flash memory.

18. The computer program product of claim 16, wherein the pool includes a next chunk of data to be written on a cell/page/sub-page/block of the memory.

* * * * *